United States Patent [19]

Widmann

[11] 4,351,100

[45] Sep. 28, 1982

[54] METHOD FOR MANUFACTURE OF INTEGRATED SEMICONDUCTOR CIRCUITS, IN PARTICULAR CCD-CIRCUITS, WITH SELF-ADJUSTING, NONOVERLAPPING POLYSILICON ELECTRODES

[75] Inventor: Dietrich Widmann, Unterhaching, Fed. Rep. of Germany

[73] Assignee: Siemens Aktiengesellschaft, Berlin & Munich, Fed. Rep. of Germany

[21] Appl. No.: 187,774

[22] Filed: Sep. 16, 1980

[30] Foreign Application Priority Data

Sep. 28, 1979 [DE] Fed. Rep. of Germany ....... 2939488

[51] Int. Cl.³ .................... H01L 21/20; H01L 21/283
[52] U.S. Cl. .................................... 29/577 C; 29/571; 29/578; 29/579; 29/580; 148/174; 156/644; 156/653; 156/657; 156/662; 357/24; 357/59
[58] Field of Search ................. 29/571, 577, 578, 579, 29/580, 591; 148/174; 156/644, 653, 657, 662; 357/24, 59

[56] References Cited

U.S. PATENT DOCUMENTS

| | | | |
|---|---|---|---|
| 3,927,468 | 12/1975 | Anthony et al. ................ | 357/24 X |
| 3,941,630 | 3/1976 | Larrabee ........................... | 357/24 X |
| 4,035,906 | 7/1977 | Tasch et al. ........................ | 29/578 |
| 4,055,885 | 11/1977 | Takemoto .............................. | 29/578 |
| 4,141,765 | 2/1979 | Druminski et al. ............. | 156/657 X |
| 4,178,396 | 12/1979 | Okano et al. .................. | 156/657 X |
| 4,240,196 | 12/1980 | Jacobs et al. ........................ | 29/578 |

OTHER PUBLICATIONS

Browne et al., "Nonoverlapping Gate Charge-Coupling . . . Applications", IEEE J. Solid-State Circuits, vol. SC 11, No. 1, Feb. 1976, pp. 203-207.

Primary Examiner—L. DeWayne Rutledge
Assistant Examiner—W. G. Saba
Attorney, Agent, or Firm—Hill, Van Santen, Steadman, Chiara & Simpson

[57] ABSTRACT

In an exemplary embodiment, a first polysilicon layer is provided with a $SiO_2$ mask, and the first polysilicon layer is etched away under the $SiO_2$ mask to produce $SiO_2$ overhangs of a lateral extent corresponding to about twice the edge position error ($\pm s$). Then when second polysilicon layers are produced by means of chemical vapor deposition (CVD), to occupy the cavities under the $SiO_2$ overhangs, the desired nonoverlapping poly-Si-2 electrodes result after definition of those poly-Si-2 electrodes by known lithographical techniques.

1 Claim, 10 Drawing Figures

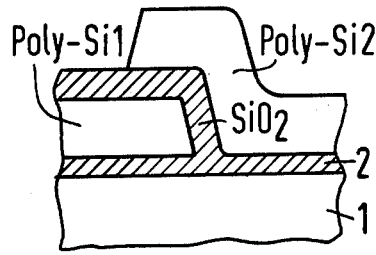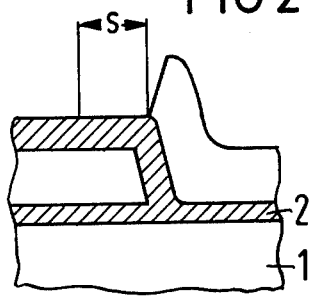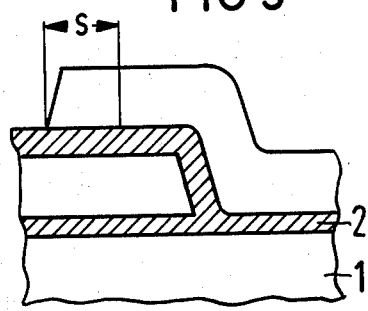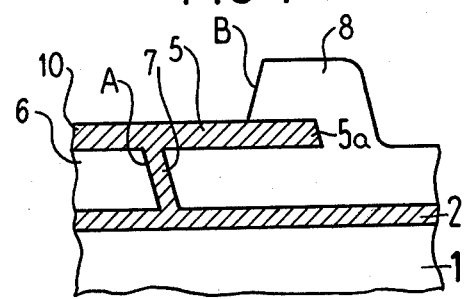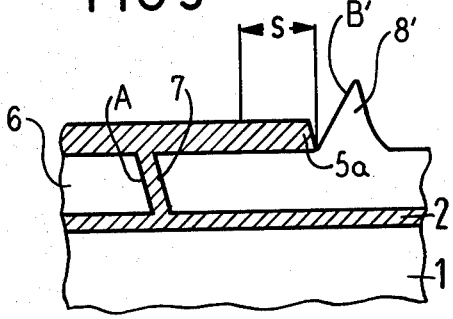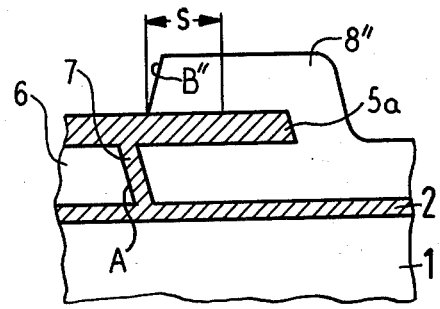

METHOD FOR MANUFACTURE OF INTEGRATED SEMICONDUCTOR CIRCUITS, IN PARTICULAR CCD-CIRCUITS, WITH SELF-ADJUSTING, NONOVERLAPPING POLYSILICON ELECTRODES

BACKGROUND OF THE INVENTION

The present invention relates to a method for manufacturing integrated semiconductor circuits, in particular CCD-circuits, with self-adjusting, nonoverlapping polysilicon electrodes. In the known double-silicon-gate processes ($Si^2$-gate-processes), as a general rule, in accordance with the known manufacturing processes, an unavoidable overlapping of the polysilicon electrodes of the second polysilicon structure level with the polysilicon electrodes of the first polysilicon structure level occurs.

Such an overlapping is undesirable on account of the increased coupling capacitance between poly-Si-1 and poly-Si-2 electrodes as well as also on account of the restricted packing density of the elecrodes.

From "IEEE Journal of Solid-State Circuits, Vol. SC 11, No. 1, February 1976", a process for producing self-adjusting, nonoverlapping aluminum electrodes with the aid of anodic oxidation and the so-called lift-off technique is known; cf. pp. 203-207 therein: "V. A. Browne and K. D. Perkins: A Non-overlapping Gate Charge-Coupling Technology for Serial Memory and Signal Processing Applications".

A technology for manufacturing integrated semiconductor circuits in which electrodes consisting of polysilicon which do not overlap are exclusively employed is not known up to the present time.

SUMMARY OF THE INVENTION

The object underlying the invention resides in creating a method of manufacture for the production of integrated semiconductor circuits, in particular CCD-circuits, by means of which the overlappings—unavoidable in the case of th known manufacturing methods—of the first with the second electrode structure are avoidable.

The object underlying the invention is achieved by a method for the manufacture of integrated semiconductor circuits, in particular CCD-circuits, with which self-adjusting, nonoverlapping polysilicon electrodes can be produced in two levels.

The inventive method is characterized in that, during the etching of polysilicon electrodes of a first type, the masking $SiO_2$ or $Si_3N_4$ structures, in order to produce overhangings of the $SiO_2$ or $Si_3N_4$ layer covering the electrodes, are laterally underetched at the edges to such an extent that the spacing between the edges of the $SiO_2$ or $Si_3N_4$ mask structures and the edges of the corresponding poly-Si-1 structures corresponds to double the amount of a maximally occurring edge position error which can result during superimposing of the poly-Si-1 structure with a second polysilicon structure, that subsequently the now-existing edges of the poly-Si-1 structures are coated with a $SiO_2$ layer for the purpose of insulation, and that subsequent thereto, in accordance with an applied mask, the second polysilicon layer is applied by means of the gas phase deposition or chemical vapor deposition (CVD), known per se, whereby the required nonoverlapping overall structure results.

The invention offers the advantage that the overlappings, bringing about interfering, undesired capacitances between adjacent electrodes within a respective integrated circuit arrangement, for example a CCD-arrangement, which overlappings are generally unavoidable due to fabrication tolerances, can be eliminated by simple means.

Further developments of the invention are characterized by the features disclosed in the subclaims.

In the following, the invention shall be explained on the basis of several Figures on the accompanying drawing sheets relating to the state of the art and sample embodiments of the invention; and other objects, features and advantages will be apparent from this detailed disclosure and from the appended claims.

BRIEF DESCRIPTION OF THE DRAWINGS

FIG. 1 schematically illustrates the cross-section of a partial zone of a circuit structure manufactured according to a conventional method, in which a poly-Si-1 layer and a poly-Si-2 layer overlap over a small width;

FIG. 2 schematically illustrates the cross-section of a partial zone of a circuit structure manufactured according to a conventional method in which the second polysilicon film is displaced by the amount s of an edge position error in the direction laterally away from the respective electrode of the first polysilicon film;

FIG. 3 schematically illustrates the cross-section of a partial zone of a circuit structure manufactured according to a conventional method in which the second polysilicon layer is displaced by the amount s of an edge position error in the direction laterally toward the respective electrode of the first polysilicon film;

FIG. 4 schematically illustrates the cross-section of a partial zone of a circuit structure manufactured according to the inventive method with an optimum position of the second polysilicon layer (8) in relation to the first polysilicon layer (6), respectively;

FIG. 5 schematically illustrates the cross-section of a partial zone of a circuit structure manufactured according to the inventive method in which the second polysilicon layer (8') is displaced by the amount s of the maximum edge position eerror in the direction laterally away from the respective electrode of the first polysilicon layer (6);

FIG. 6 schematically illustrates the cross-section of a partial zone of a circuit structure manufactured in accordance with the inventive method in which the electrode of the second polysilicon layer (8") is displaced by the amount s of the maximally occurring edge position error in the direction laterally toward the electrode of the first polysilicon layer (6);

DETAILED DESCRIPTION

Reference is made to the foregoing Brief Description of the Drawings for an introductory detailed description. Further background information is found in my related German application P 29 39 456.7 filed Sept. 28, 1979, and in my corresponding U.S. patent application Ser. No. 187,773, filed Sept. 16, 1980.

As already stated FIGS. 4, 5, 6 schematically illustrate cross-sections of circuit structures which can be produced in accordance with the present invention. In the etching of the poly-Si-1 electrodes 6, the masking SiO$_2$ or Si$_3$N$_4$ structures such as indicated at 5, 10, whose thickness amounts to approximately 0.1 micrometer, are underetched laterally at the edges such as 5a to such an extent that the spacing between the lateral edges such as 5a of the SiO$_2$ or Si$_3$N$_4$ mask structures such as 5, 10, respectively, and the lateral edges such as indicated at A of the corresponding, etched poly-Si-1 structures such as 6 corresponds to double the edge position error ±s, which can result, during superimposing of the two poly-Si-structure levels (such as 6, 8, FIG. 4; 6, 8', FIG. 5; and 6, 8'', FIG. 6), between poly-Si-1 and poly-Si-2 structure edges (such as A and B; FIG. 4; A and B', FIG. 5; and A and B'', FIG. 6).

Following this underetching, an SiO$_2$ layer such as 7, FIGS. 4–8, for insulation of the respective poly-Si-1 electrodes such as 6 with respect to adjacent electrodes such as 8 is applied. This occurs advantageously by thermal oxidation. After deposition of a second polysilicon layer by chemical vapor deposition the poly-Si-2 electrodes 8 are defined by known lithographical techniques. The edges of the poly-Si-2 electrodes are located somewhere between positions B', FIG. 5, and B'', FIG. 6, leading to self-adjusting nonoverlapping electrodes.

Figure 7:
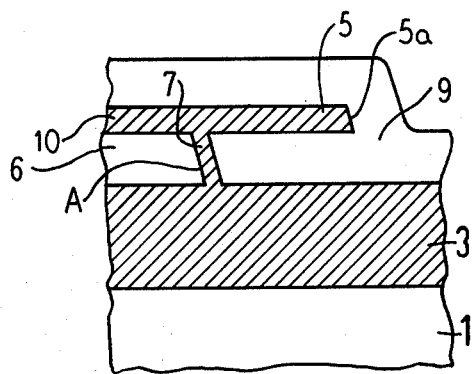
FIG. 7 schematically illustrates the cross-section of a partial zone at the periphery of the previously cited circuit arrangement in which a second polysilicon layer (9) is applied beneath and above an inventive overhang (5) of the $SiO_2$ layer.
Figure 8:
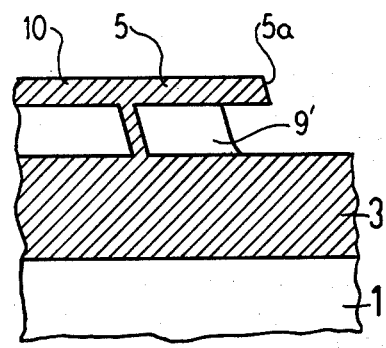
FIG. 8 schematically shows the cross-section of a partial zone of the circuit arrangement according to FIG. 7 in which, after etching-away a specific layer thickness of the second polysilicon layer (9), a residue (9') of this second polysilicon layer remains in the cavity beneath the overhang (5) of the $SiO_2$ layer.
Figure 9:
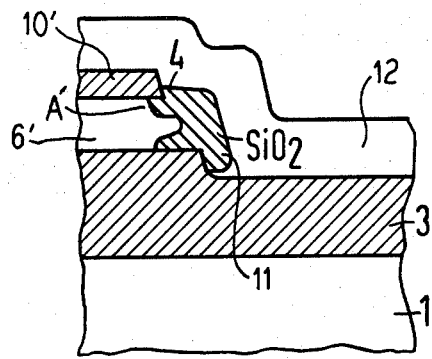
FIG. 9 schematically illustrates the cross-section of a partial zone of the periphery of the respective circuit structure in which, prior to application of a second polysilicon layer (12), the overhang of the $SiO_2$ layer has been etched away, and in which the second polysilicon layer (12) is applied in a subsequent process step.
Figure 10:
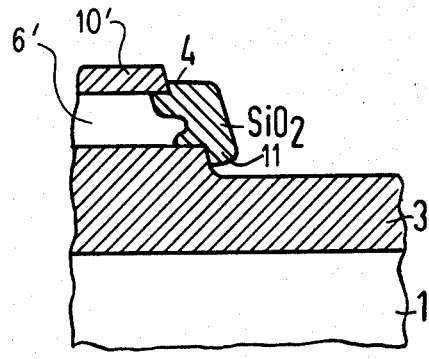
FIG. 10 schematically illustrates the cross-section of the partial zone—illustrated in FIG. 9—of the respective circuit structure, in which the second polysilicon layer (12) is etched away in the region of the SiO$_2$ layer (10'), disposed above the first polysilicon layer (6'), and in the region of the field oxide layer 3.

According to a further development of the invention, it is provided that, in those zones, preferably the zones at the periphery of the CCD circuit as indicated in FIGS. 9 and 10, in which poly-Si-2 interconnections are provided intersecting poly-Si-1 lines, the overhangs 5, following the etching of the first polysilicon layer poly-Si-1 (such as 6) to leave an edge such as A', are etched away by process steps which are known per se to such an extent that only a masking layer portion 10' remains, and all respectively resulted contact hole edges 4 are positioned on the surfaces of the pertaining electrodes 6', so that, after a thermal oxidation to produce SiO$_2$ layer 11, and after the etchingaway of the second polysilicon layer poly-Si-2 (which is indicated at 12 in FIG. 9), no residues of the second polysilicon layer poly-Si-2 (12, FIG. 9), causing short circuits, remain in the cited zones (as shown in FIG. 10).

It will be apparent that many modifications and variations may be effected without departing from the scope of the novel concepts and teachings of the present invention.

I claim as my invention:

1. In a method for manufacturing self-adjusted nonoverlapping polysilicon electrodes (poly-Si-1 and poly-Si-2) in integrated CCD semiconductor circuits wherein a polysilicon-1-electrode (6) is first formed with a masking layer thereon of SiO$_2$ or Si$_3$N$_4$, said method further comprising:
   (a) etching the polysilicon-1-electrode (6) during the presence of said masking layer (5, 10) of SiO$_2$ or Si$_3$N$_4$ in covering relation thereto,
   (b) carrying out the etching of the polysilicon-1-electrode (6) to such degree that lateral underetching occurs at an edge (5a) of the masking layer (5, 10) covering the polysilicon-1-electrode (6) to form an overhang (5) of the masking layer (10) with an edge (5a) of the overhang (5) of the masking layer (10) having a spacing from the edge (A) of the etched polysilicon-1-electrode (6) corresponding to twice the amount of a maximally occurring edge position error (±s) which can arise in the superposition of a polysilicon-2-electrode with an edge (B) onto the polysilicon-1-electrode,
   (c) carrying out a thermal oxidation step whereby the edge (A) of the polysilicon-1-electrode is covered with an SiO$_2$ layer (7), and
   (d) applying a second polysilicon layer by means of a chemical vapor deposition step known per se, with the use of a mask, to generate the non-overlapping polysilicon-2-electrode (8) at a level above the level of the overhang (5) while also filling the hollow below the overhang with silicon.

* * * * *